United States Patent
Pons

(10) Patent No.: US 9,958,889 B2
(45) Date of Patent: May 1, 2018

(54) HIGH AND LOW POWER VOLTAGE REGULATION CIRCUIT

(71) Applicant: STMicroelectronics (Alps) SAS, Grenoble (FR)

(72) Inventor: Alexandre Pons, Vizille (FR)

(73) Assignee: STMicroelectronics (Alps) SAS, Grenoble (FR)

( * ) Notice: Subject to any disclaimer, the term of this patent is extended or adjusted under 35 U.S.C. 154(b) by 0 days. days.

(21) Appl. No.: 14/868,095

(22) Filed: Sep. 28, 2015

(65) Prior Publication Data
US 2016/0224042 A1    Aug. 4, 2016

(30) Foreign Application Priority Data

Feb. 2, 2015 (FR) ...................................... 15 50794

(51) Int. Cl.
| | |
|---|---|
| *G05F 1/575* | (2006.01) |
| *H02J 1/02* | (2006.01) |
| *H03K 19/00* | (2006.01) |

(52) U.S. Cl.
CPC ................ *G05F 1/575* (2013.01); *H02J 1/02* (2013.01); *H03K 19/0016* (2013.01)

(58) Field of Classification Search
CPC .. G05F 1/595; G05F 1/59; G05F 1/563; H02J 1/02; H03K 19/0016
USPC .................................. 323/225, 226, 268, 270
See application file for complete search history.

(56) References Cited

U.S. PATENT DOCUMENTS

| | | | | |
|---|---|---|---|---|
| 6,201,375 B1* | 3/2001 | Larson | .................... | G05F 1/573 323/277 |
| 6,215,292 B1* | 4/2001 | Maggi | .................... | G05F 3/267 323/315 |
| 6,265,856 B1* | 7/2001 | Cali' | ....................... | G05F 1/575 323/273 |
| 6,703,813 B1* | 3/2004 | Vladislav | ................ | G05F 1/575 323/270 |
| 6,894,467 B2* | 5/2005 | Pons | ....................... | G05F 3/242 323/273 |
| 6,958,595 B2* | 10/2005 | Niiyama | ............. | H02M 3/1582 323/282 |
| 6,989,660 B2* | 1/2006 | Mauthe | ................... | G05F 1/465 323/274 |

(Continued)

FOREIGN PATENT DOCUMENTS

| | | |
|---|---|---|
| EP | 1 061 428 A1 | 12/2000 |
| FR | 2 879 771 A1 | 6/2006 |

*Primary Examiner* — Kyle J Moody
(74) *Attorney, Agent, or Firm* — Seed IP Law Group LLP

(57) ABSTRACT

The present disclosure relates to a voltage regulation circuit including a first transistor connected between an input of voltage to be regulated and an output of a regulated voltage. A first regulation loop controls the first transistor according to a difference between a reference voltage and a first feedback voltage derived from the regulated voltage. A second transistor is connected in series between the first transistor and the output. A second regulation loop controls the second transistor according to a difference between the reference voltage and a second feedback voltage derived from the regulated voltage. The second regulation loop is active in low and high power regulation modes. A switch circuit forces the first transistor into an on state in a low power regulation mode.

18 Claims, 3 Drawing Sheets

(56) References Cited

U.S. PATENT DOCUMENTS

| | | | |
|---|---|---|---|
| 7,199,567 B2 * | 4/2007 | Eberlein | G05F 1/575 323/270 |
| 7,525,294 B2 * | 4/2009 | Messager | G05F 1/575 323/268 |
| 7,679,433 B1 * | 3/2010 | Li | H03F 1/0244 330/10 |
| 7,683,592 B2 * | 3/2010 | Soude | G05F 1/575 323/269 |
| 7,868,676 B2 * | 1/2011 | Koh | G05F 1/56 327/108 |
| 7,872,533 B2 * | 1/2011 | Adamski | H03F 1/0261 330/296 |
| 8,040,118 B2 | 10/2011 | Cho et al. | |
| 8,305,056 B2 * | 11/2012 | Wadhwa | G05F 1/56 323/270 |
| 8,866,341 B2 | 10/2014 | Riederer | |
| 2010/0308919 A1 | 12/2010 | Adamski et al. | |
| 2012/0049815 A1 * | 3/2012 | Veeramreddi | H02M 3/158 323/282 |
| 2013/0234677 A1 | 9/2013 | Mok et al. | |
| 2013/0271095 A1 * | 10/2013 | Jackum | G05F 1/56 323/270 |
| 2013/0300382 A1 * | 11/2013 | Tsai | H03F 1/223 323/270 |
| 2014/0117952 A1 * | 5/2014 | Li | G05F 1/565 323/271 |

\* cited by examiner

HIGH AND LOW POWER VOLTAGE REGULATION CIRCUIT

BACKGROUND

Technical Field

The present disclosure relates to power supply circuits in particular for portable devices, and in particular portable devices powered through a USB port (Universal Serial Bus) or by a battery rechargeable via such a port.

Description of the Related Art

A USB port is generally connected to a low dropout voltage regulator, enabling a regulated voltage generally comprised between 2.7 and 3.5V to be supplied. Such a circuit can receive varied voltages both low, of a few volts, and high, up to about twenty volts, with voltage peaks which can reach 30V. Furthermore, in a battery charger application, a voltage of a few volts may be present at the output of the regulation circuit, independently of the presence of the supply voltage to be regulated.

High voltage regulation circuits produced in CMOS technology have the disadvantage of implementing a specific power circuit comprising a high voltage MOS transistor (of drift or extended drain type), or cascode-mounting of transistors. Such a circuit is not suited to operate with a low consumption, in particular in a standby mode.

FIG. 1 represents an example of a conventional regulation circuit VRG1 linked to a USB port. The circuit VRG1 comprises a P-channel MOS transistor P11, comprising a source terminal receiving the voltage Vi to be regulated, supplied at input In of the circuit VRG1, a gate terminal connected to the output of an error amplifier CP11 and a drain terminal supplying a regulated voltage Vo at an output Out of the circuit VRG1. The error amplifier CP11 receives a reference voltage Vrf at a non-inverting input and, at an inverting input, a feedback voltage Vfb equal to a fraction of the output voltage Vo. The voltage Vfb is produced using a divider bridge comprising resistors R11, R12 mounted in series, the resistor R11 being connected between the non-inverting input and the output Out, the resistor R12 being connected in series with resistor R11 to the ground, and the voltage Vfb being supplied by the junction node between the resistors R11, R12. Generally, the output voltage is filtered by a filter capacitor C11 connected to ground. The transistor P11 is configured to tolerate high voltages at input and to supply a current, which may be high, to the charge supplied by the output voltage Vo. In operation, the transistor P11 is controlled to increase or reduce the current passing through it according to the difference Vrf−Vfb between the voltages Vrf and Vfb at input of the amplifier CP11. The assembly of the amplifier CP11, the transistor P11 and the resistor R11 thus forms a voltage regulation loop.

The circuit VRG1 is not provided to operate in low consumption or low power mode, i.e., with a low input voltage (for example lower than or equal to 5V) while consuming little current (for example lower than 100 μA). Furthermore, the circuits powered by such a power circuit must comprise a supplementary circuit using selector switches to adapt to the different high and low power supply configurations. In addition, the transistor P11, of drift or extended channel type, introduces into the circuit on its gate side, high stray capacitances imposing a low impedance on the output Out of the regulation circuit VRG1, which significantly influences the current consumption of the device integrating the circuit VRG1.

To solve this problem, proposals have been made to reduce bias currents in the regulation circuit by introducing several components having adjustable characteristics into it. The presence of these adjustable components in the regulation circuit renders the latter complex to control.

Proposals have also been made to introduce into the regulation circuit VRG1 a second regulation loop in parallel to the regulation loop formed by the amplifier CP11, the transistor P11 and the resistor R11. This solution requires a second high voltage transistor, and thus of a significant size, comparable to that of the transistor P11, to be capable of tolerating high input voltages. This solution also requires switch circuits to deactivate one or the other loop depending on the operating mode of the regulation circuit, as well as a relatively complex circuit for controlling these switch circuits, to avoid over voltages from forming when switching between the high and low power operating modes.

It is thus desirable to provide a voltage regulation circuit that is capable of operating at high and low power without any excessive consumption, particularly at low power. It may further be desirable to propose a voltage regulation circuit having a protection against short-circuits.

BRIEF SUMMARY

Some embodiments relate to a voltage regulation circuit comprising: a first transistor connected between an input of an input voltage to be regulated and an output of a regulated voltage, and a first regulation loop supplying the first transistor with a first control voltage depending on a difference between a reference voltage and a first feedback voltage derived from the regulated voltage. According to one embodiment, the regulation circuit comprises: a second transistor connected in series between the first transistor and the output of the regulation circuit, a second regulation loop supplying the second transistor with a second control voltage depending on a difference between the reference voltage and a second feedback voltage derived from the regulated voltage and different from the first feedback voltage, the second regulation loop being active in low and high power regulation modes, and a switch circuit to force the first transistor into an on state in the low power regulation mode.

According to one embodiment, the second transistor is designed to tolerate lower voltages than the first transistor.

According to one embodiment, the second feedback voltage is lower than the first feedback voltage.

According to one embodiment, the regulation circuit comprises a third transistor connected in series with the second transistor between the second transistor and the output of the regulation circuit, the third transistor being controlled by the second control voltage.

According to one embodiment, the regulation circuit comprises a feedback circuit comprising a first resistor connected to the output of the regulation circuit, and a second resistor connected between the first resistor and a third resistor connected to the ground, a junction node between the first and the second resistor supplying the first feedback voltage and a junction node between the second and the third resistor supplying the second feedback voltage.

According to one embodiment, the second transistor is configured to operate in linear mode in the high power regulation mode.

According to one embodiment, each of the first and second regulation loops comprises an error amplifier supplying the transistor controlled by the loop with the control voltage, and receiving at input the reference voltage and one of the feedback voltages.

According to one embodiment, the error amplifier of the second regulation loop has a gain greater than or equal to about one hundred.

According to one embodiment, the error amplifier of the first regulation loop comprises the switch circuit.

Some embodiments also relate to a method for regulating voltage, comprising steps of controlling a first transistor receiving a voltage to be regulated and supplying a regulated voltage, according to a difference between a reference voltage and a first feedback voltage derived from the regulated voltage. According to one embodiment, the method comprises steps of controlling a second transistor mounted in series with the first transistor, according to a difference between the reference voltage and a second feedback voltage derived from the regulated voltage and different from the first feedback voltage, during low and high power regulation modes, the first transistor being controlled only during the high power regulation mode, and forcing the first transistor into an on state during the low power regulation mode.

According to one embodiment, the method comprises steps of deriving the first and second feedback voltages in the high power regulation mode, according to the output voltage, so that the first feedback voltage is between the output voltage and the second feedback voltage and so that the second feedback voltage is strictly positive.

According to one embodiment, the second transistor is controlled in a linear mode in the first voltage regulation mode.

According to one embodiment, the control of the second transistor according to a difference between the reference voltage and the second feedback voltage is applied in parallel to a third transistor mounted in series between the second transistor and an output of the regulated voltage.

BRIEF DESCRIPTION OF THE SEVERAL VIEWS OF THE DRAWINGS

Some examples of embodiments of the present disclosure will be described below in relation with, but not limited to, the accompanying figures, in which.

DETAILED DESCRIPTION

Figure 1:
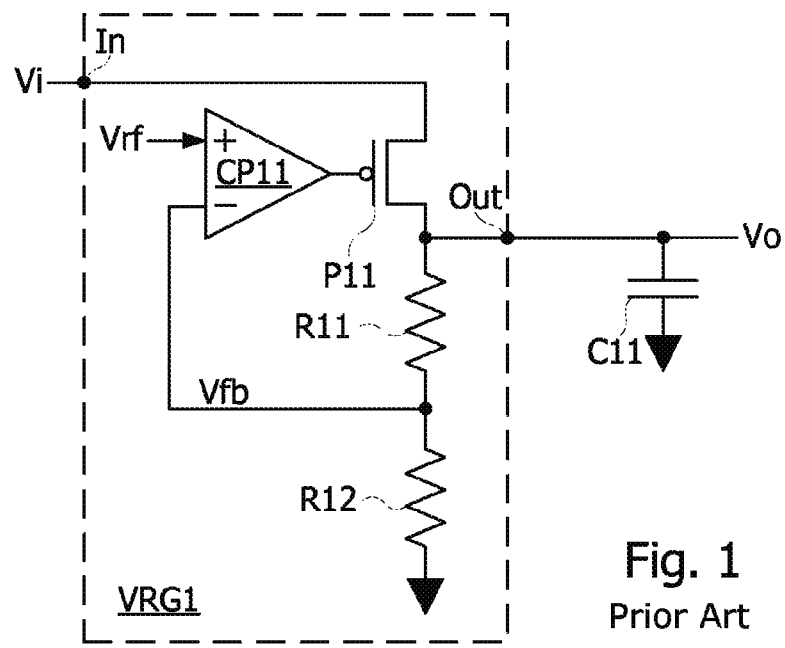
FIG. 1 described above represents a conventional voltage regulation circuit.
Figure 2:
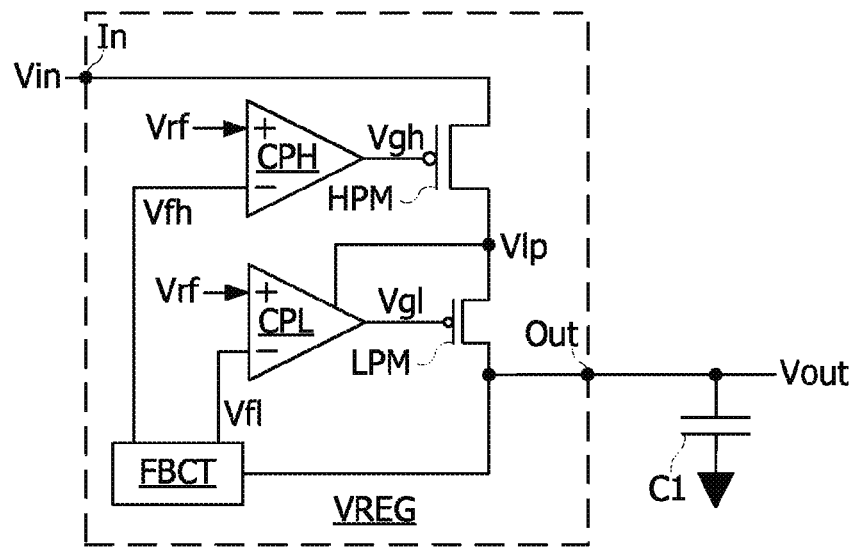
FIG. 2 represents a voltage regulation circuit, according to one embodiment of the present disclosure.

FIG. 2 represents a voltage regulation circuit VREG, according to one embodiment. The circuit VREG comprises a P-channel transistor HPM, comprising a source terminal receiving the voltage to be regulated Vin supplied at input In of the circuit VREG, a gate terminal connected to the output of an error amplifier CPH and a drain terminal supplying a voltage Vlp. The error amplifier CPH receives a reference voltage Vrf at a non-inverting input and, at an inverting input, a feedback voltage Vfh derived from the output voltage Vout and equal to a fraction of the latter. The error amplifier CPH supplies the gate of the transistor HPM with a control voltage Vgh. The feedback voltage Vfh is produced by a feedback circuit FBCT connected to the output Out of the circuit VREG. As above, the output voltage Vout is filtered by a filter capacitor C1 connected to the ground. The transistor HPM can be of drift or extended channel type to tolerate relatively high voltages.

Thus, the regulation circuit VREG comprises a first regulation loop for regulating the input voltage Vin comprising the amplifier CPH, the transistor HPM and the feedback circuit FBCT. According to one embodiment, the circuit VREG comprises a second regulation loop for regulating the input voltage Vin, comprising an error amplifier CPL, a P-channel MOS transistor LPM, mounted in series with the transistor HPM, and the feedback circuit FBCT. The transistor LPM couples the drain terminal of the transistor HPM to the output Out of the circuit VREG. The gate terminal of the transistor LPM is connected to the output of the error amplifier CPL receiving the reference voltage Vrf at a non-inverting input, and a feedback voltage Vfl at an inverting input. The error amplifier CPL supplies the gate of the transistor LPM with a control voltage Vgl. The feedback voltage Vfl is supplied by the feedback circuit FBCT.

According to one embodiment, the feedback circuit FBCT is configured so that the feedback voltage Vfh is greater than the feedback voltage Vfb produced in the circuit VRG1 (comprising only one regulation loop), and so that the voltage Vfl is lower than the voltage Vfb. In other words, the voltages Vfh and Vfl are such that Vout>Vfh>Vfb>Vfl>0.

The voltage regulation circuit VREG is configured to operate either in a high power regulation mode or in a low power regulation mode. In the low power regulation mode, the amplifier CPH is deactivated, only the amplifier CPL being active. In the high power regulation mode, the two amplifiers CPH, CPL may be active. According to one embodiment, the gate of the transistor HPM is grounded in the low power regulation mode so as to be on. The low power regulation mode is activated when the input voltage Vin is relatively low, for example lower than or equal to 5V. The grounding of the gate of the transistor HPM is for example performed by the error amplifier CPH.

In the high power regulation mode, the two regulation loops are thus active. The transistor LPM does not therefore have to tolerate voltages as high as the transistor HPM. The transistor LPM can thus be a simple standard transistor. The source-gate voltage Vsgh of the transistor HPM can be assessed by the following equation:

$$Vsgh = Ahp(Vrf - Vfh) + Vh0 \quad (1)$$

Ahp being the gain of the amplifier CPH, and Vh0 being the nominal voltage between the source and the gate of the transistor HPM. The source-gate voltage Vsgl of the transistor LPM can be assessed by the following equation:

$$Vsgl = Alp(Vrf - Vfl) + Vl0 \quad (2)$$

Alp being the gain of the amplifier CPL, and Vl0 being the nominal voltage between the source and the gate of the transistor LPM.

Figure 3:
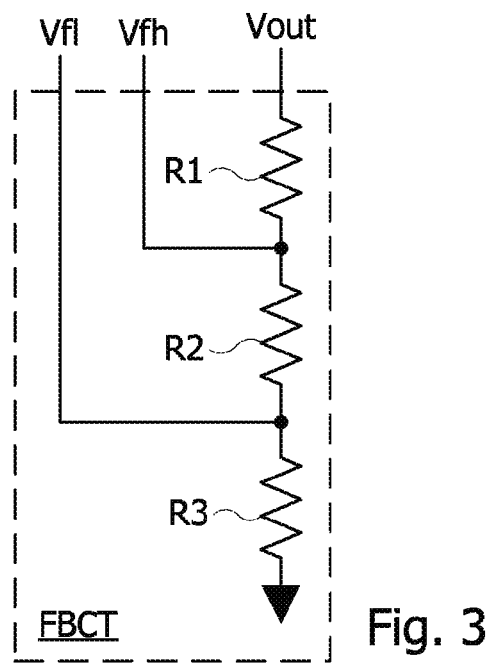
FIG. 3 represents an example of a feedback circuit of the voltage regulation circuit of FIG. 2.

FIG. 3 represents an example of feedback circuit FBCT. On FIG. 3, the circuit FBCT comprises resistors R1, R2, R3 mounted in series between the output Out and the ground. Thus, the resistor R1 is connected between the output Out and the resistor R2, and the resistor R3 is connected between the resistor R2 and the ground. The junction node between the resistors R1 and R2 supplies the feedback voltage Vfh, and the junction node between the resistors R2 and R3 supplies the feedback voltage Vfl.

The voltages Vfh and Vfl can be defined by the following equations:

$$Vfh = (R2 + R3)/(R1 + R2 + R3) * Vout \quad (3)$$

$$Vfl = R3/(R1 + R2 + R3) * Vout \quad (4)$$

By setting down $A0=(R2/2+R3)/(R1+R2+R3)$ and $DA=(R2/2)/(R1+R2+R3)$, the following is obtained:

$$Vfh=(A0+DA)*Vout \quad (5)$$

$$Vfl=(A0-DA)*Vout \quad (6)$$

Thus, the feedback circuit enables voltages offset by DA*Vout in relation to a nominal voltage A0*Vout to be generated. It shall be noted that the differences between the nominal voltage and the voltages Vfh and Vfl are not necessarily equal.

It will be understood that the feedback circuit FBCT can be produced by other simple assemblies using resistors and possibly sources of current, which can be adjustable.

Figure 4:
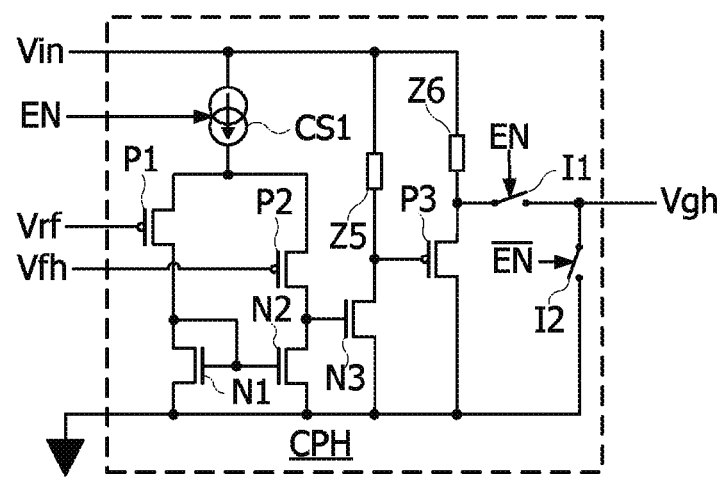
FIGS. 4 and 5 represent error amplifiers of the voltage regulation circuit, according to some embodiments.

FIG. 4 represents an example of an embodiment of the error amplifier CPH. On FIG. 4, the amplifier CPH comprises a differential amplifier powered by a current source CS1, a current mirror, an amplification stage and a follower-type buffer stage, and a switch circuit. The differential amplifier comprises two P-channel MOS transistors P1, P2. The current mirror comprises two N-channel MOS transistors N1, N2. The amplification stage comprises an N-channel MOS transistor N3 and an impedance Z5. The buffer stage comprises a P-channel MOS transistor P3 and an impedance Z6. The switch circuit comprises two switches I1, I2. The current source CS1 comprises a terminal receiving the voltage Vin and another terminal connected to source terminals of the transistors P1 and P2. The transistor P1 comprises a gate terminal receiving the voltage Vrf, and a drain terminal connected to the gates of the transistors N1, N2 and to the drain of the transistor N1. The transistor P2 comprises a gate terminal receiving the voltage Vfh and a drain terminal connected to a drain terminal of the transistor N2 and to a gate terminal of the transistor N3. The impedance Z5 comprises a terminal receiving the voltage Vin and another terminal connected to a drain terminal of the transistor N3 and to a gate terminal of the transistor P3. The impedance Z6 comprises a terminal receiving the voltage Vin and another terminal connected to a source terminal of the transistor P3. The source terminals of the transistors N1, N2 and N3, and the drain terminal of the transistor P3 are connected to the ground. Thus, the differential stage comprises differential inputs receiving the voltages Vrf and Vfh, and a single output via the drain of the transistor P2. The first and second amplification stages are configured to reach, at output of the amplifier CPH, a control voltage (Vgh) sufficient to control the transistor HPM. The impedances Z5 and Z6 may be formed by one or more resistors, and/or one or more capacitors, and/or one or more current sources.

The switch I1 is connected between the source terminal of the transistor P3 and an output of the circuit CPH supplying the control voltage Vgh of the transistor HPM. The switch I2 is connected between the output of the circuit CPH and the ground. Thus, when the switch I2 is closed, the output voltage Vgh of the circuit CPH is grounded. The switch I1 is open when the switch I2 is closed and closed when the switch I2 is open. Thus, the amplifier CPH is deactivated when the switch I1 is open and the switch I2 is closed, and activated in the opposite configuration of the switches I1, I2. When the amplifier CPH is deactivated, the gate terminal of the transistor HPM is grounded by the switch I2, rendering the transistor HPM on. When the low power regulation mode is activated, the current source CS1 can be deactivated to prevent current from being unnecessarily consumed. Thus, a same signal EN can be used to control the activation of the current source, the closing of the switch I1 and the opening of the switch I2. It shall be noted that, instead of grounding the gate terminal of the transistor HPM, the latter can be put to a sufficiently low positive voltage so that the transistor HPM is on.

Figure 5:
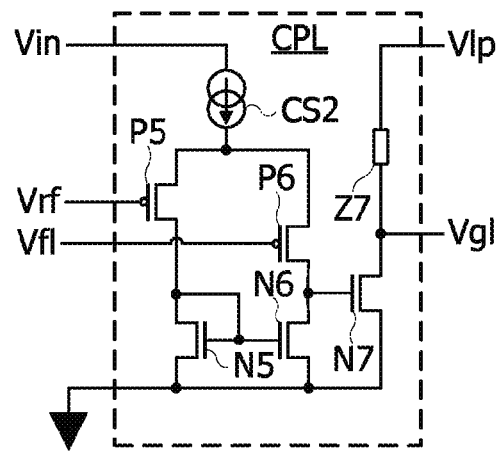

FIG. 5 represents an example of an embodiment of the error amplifier CPL. On FIG. 5, the amplifier CPL has a structure similar to the amplifier CPH, with the difference that it does not comprise any switches and only a single amplification stage instead of two. Thus, the amplifier CPL comprises a current source CS2, two P-channel MOS transistors P5, P6, forming a differential stage, two N-channel MOS transistors N5, N6, forming a current mirror, and an N-channel MOS transistor N7, and an impedance Z7, forming the amplification stage. The current source CS2 comprises a terminal receiving the voltage Vin and another terminal connected to source terminals of the transistors P5 and P6. The transistor P5 comprises a gate terminal receiving the voltage Vrf, and a drain terminal connected to the gates of the transistors N5, N6 and to the drain of the transistor N5. The transistor P6 comprises a gate terminal receiving the voltage Vfl and a drain terminal connected to a drain terminal of the transistor N6 and to a gate terminal of the transistor N7. The impedance Z7 comprises a terminal receiving the voltage Vlp taken off at the drain of the transistor HPM and at the source of the transistor LPM, and another terminal connected to a drain terminal of the transistor N7 forming the output of the amplifier CPL supplying the gate of the transistor LPM with the control voltage Vgl. The differential stage comprises differential inputs receiving the voltages Vrf and Vfl, and a single output via the drain of the transistor P6. The transistor N7 and the impedance Z7 forming the amplification stage are chosen to reach at output of the amplifier CPL a control voltage (Vgl) sufficient to control the transistor LPM. The impedance Z7 can be formed by one or more resistors, and/or one or more capacitors, and/or one or more current sources.

The high power regulation mode is activated for example in a USB charger application connected to an alternating voltage source. The high power regulation mode can therefore be active when charging a battery. The voltage Vin can be supplied to the regulation circuit VREG by the line VBUS of a USB cable. In this state, the amplifier CPH is active (the switch I1 is closed and the switch I2 is open). Due to the presence of the two regulation loops, two solutions are possible to determine the output voltage Vout in a stabilized state:

$$Vout=1/(A0+DA)*Vrf \quad (7)$$

$$Vout=1/(A0-DA)*Vrf \quad (8)$$

It can be deduced from the equations (2), (6) and (7) that:

$$Vsgl=Alp(2DA/(A0+DA))Vrf+Vl0 \quad (9)$$

Similarly, it can be deduced from the equations (1), (5) and (8) that:

$$Vsgh=Ahp(2DA/(A0-DA))Vrf+Vh0 \quad (10)$$

The solution corresponding to the equation (10) provides a negative result. This solution is thus not adapted to the control of the transistor HPM. As a result, only the solution corresponding to the equation (9) provides a result defining a state of balance when the voltage Vsgl is high compared to the threshold voltage of the transistors HPM, LPM, and when the amplification gain Alp is chosen so as to be much higher than 1, for example in the order of several hundred to a thousand. In these conditions, the only point of balance is reached when the voltage Vout has the value given by the equation (7). The transistor LPM operates in linear mode, its drain voltage being proportional to the current at the output Out of the circuit VREG.

The low power regulation mode is activated for example in a USB charger application in standby mode, when the battery is fully charged. In this state, the amplifier CPH is deactivated, the switch I1 being open and the switch I2 closed. The result is that in a stabilized state, the feedback voltage Vfl is equal to the reference voltage Vrf and the output voltage Vout has the value given by the equation (8).

The presence at output of the regulation circuit of the transistor LPM, which is much smaller than the transistor HPM, enables a resistance to be obtained for accessing the drain that is much lower than that of the transistor HPM and a capacitance between the gate and the drain also much lower. The result is a lower current consumption and a better regulation in low power regulation mode. Furthermore, as the low power regulation loop is always active, the transitions between the low and high power modes are progressive, which avoids introducing overlapping phases or wait times between the deactivation of the low power mode and the activation of the high power regulation mode, to avoid the appearance of overvoltages.

Figure 6:
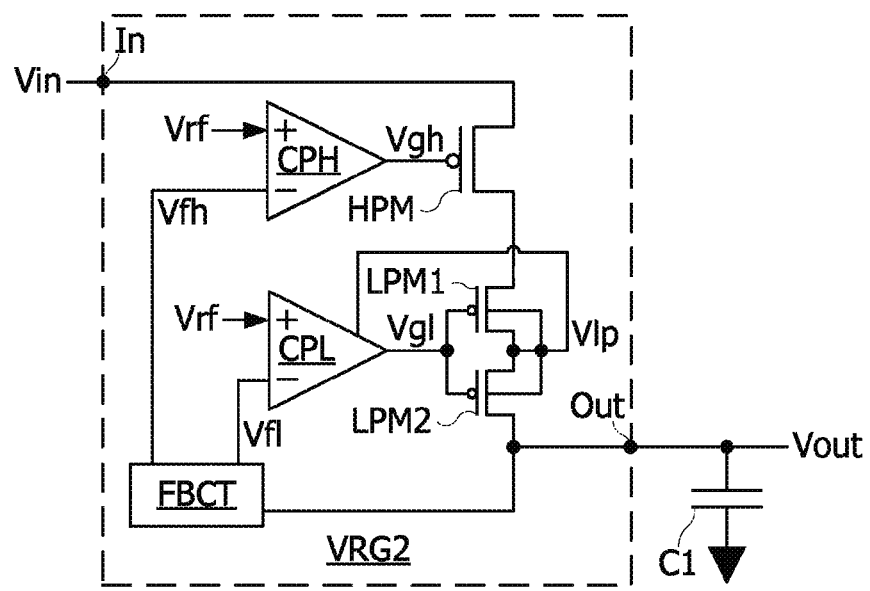
FIG. 6 represents a voltage regulation circuit according to another embodiment.

FIG. 6 represents a voltage regulation circuit VRG2, according to another embodiment. The circuit VRG2 differs from the circuit VREG in that the transistor LPM is replaced with two transistors LPM1, LPM2 mirror connected in series, the drain terminals of the two transistors being connected to one another (with substrate diodes mounted head-to-tail). Each of the transistors LPM1, LPM2 comprises a gate terminal connected at output of the amplifier CPL. The voltage Vlp at input of the amplifier CPL is taken at the drain terminals of the transistors LPM1, LPM2. The voltage Vlp can also be used to bias the semiconductor substrate in which the transistors LPM1 and LPM2 are formed. The transistors LPM1, LPM2 may be simple standard transistors. In this way, the circuit VRG2 is able both to operate efficiently in the high and low power regulation modes, and to ensure an efficient protection against short-circuits between the voltage Vin and the ground.

It will be understood by those skilled in the art that the present disclosure is susceptible of various alternative embodiments and various applications. In particular, the present disclosure does not solely apply to USB ports, but can apply to any supply voltage susceptible of having relatively significant variations.

The present disclosure is not limited to the feedback circuit FBCT presented in FIG. 3, and other feedback circuits can easily be designed so as to derive from the output voltage Vout the different voltages Vfh and Vfl, on the understanding that if the voltage Vout decreases, the voltages Vfh and Vfl decrease too, and conversely, if the voltage Vout increases, the voltages Vfh and Vfl increase too. The present disclosure is not limited either to using an error amplifier in the regulation loops. Indeed, such an amplifier may be replaced with other devices ensuring a comparison and shaping function for comparing the signals Vrf and Vfh or Vfl and for shaping the output signal of the comparison function to control the transistors HPM and LPM.

Furthermore, even though this may not typically be desirable, the transistor LPM may have characteristics comparable to those of the transistor HPM.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A voltage regulation circuit comprising: a first transistor coupled between an input of an input voltage to be regulated and an output of a regulated voltage; a first regulation loop supplying the first transistor with a first control voltage depending on a difference between a reference voltage and a first feedback voltage derived from the regulated voltage; a second transistor coupled in series between the first transistor and the output of the regulated voltage; wherein the first transistor is configured to withstand higher voltages than the second transistor; a second regulation loop supplying the second transistor with a second control voltage depending on a difference between the reference voltage and a second feedback voltage derived from the regulated voltage and different from the first feedback voltage, the second regulation loop being, active in low and high power regulation modes; and a switch circuit to force the first transistor into an on state in the low power regulation mode.

2. The voltage regulation circuit according to claim 1, wherein the second feedback voltage is lower than the first feedback voltage.

3. A voltage regulation circuit, comprising:
a first transistor connected between an input of an input voltage to be regulated and an output of a regulated voltage;
a first regulation loop supplying the first transistor with a first control voltage depending on a difference between a reference voltage and a first feedback voltage derived from the regulated voltage;
a second transistor connected in series between the first transistor and the output of the regulation circuit;
a second regulation loop supplying the second transistor with a second control voltage depending on a difference between the reference voltage and a second feedback voltage derived from the regulated voltage and different from the first feedback voltage, the second regulation loop being active in low and high power regulation modes;
a switch circuit to force the first transistor into an on state in the low power regulation mode; and
a third transistor connected in series with the second transistor between the second transistor and the output of the regulation circuit, the third transistor being controlled by the second control voltage.

4. The voltage regulation circuit according to claim 3 further comprising a feedback circuit comprising a first resistor connected to the output of the regulation circuit, and a second resistor connected between the first resistor and a third resistor connected to a ground node, a junction node between the first and the second resistor supplying the first feedback voltage and a junction node between the second and the third resistor supplying the second feedback voltage.

5. The voltage regulation circuit according to claim 4, wherein the second transistor is configured to operate in linear mode in the high power regulation mode.

6. The voltage regulation circuit according to claim 5, wherein each of the first regulation loop and the second regulation loop comprises a respective error amplifier supplying the first transistor and the second transistor with the first and second control voltage, respectively, and each respective error amplifier receiving at an input the reference voltage and one of the first and second feedback voltages.

7. The voltage regulation circuit according to claim 6, wherein the error amplifier of the second regulation loop has a gain greater than or equal to about one hundred.

8. The voltage regulation circuit according to claim 7, wherein the error amplifier of the first regulation loop comprises the switch circuit.

9. A method for regulating a voltage, comprising:
controlling a first transistor, receiving a voltage to be regulated, to supply a regulated voltage according to a difference between a reference voltage and a first feedback voltage derived from the regulated voltage in a high power regulation mode that is based upon a value of the regulated voltage;
controlling a second transistor, coupled in series with the first transistor, to supply the regulated voltage according to a difference between the reference voltage and a second feedback voltage derived from the regulated voltage and different from the first feedback voltage;
forcing the first transistor into an on state during a low power regulation mode that is based upon the value of the voltage being regulated; and
applying the control of the second transistor according to the difference between the reference voltage and the second feedback voltage in parallel to a third transistor coupled in series between the second transistor and an output of the regulated voltage.

10. The method according to claim 9 further comprising deriving the first and second feedback voltages in the high power regulation mode, according to the regulated voltage, so that the first feedback voltage is between the regulated voltage and the second feedback voltage and so that the second feedback voltage is strictly positive.

11. The method according to claim 10, wherein the second transistor is controlled in a linear mode in the high power regulation mode.

12. A portable electronic device, comprising:
electronic circuitry including a USB port, a rechargeable battery, and a battery charger; and
a voltage regulation circuit coupled to the electronic circuitry to receive an input voltage from either the USB port or the battery, the voltage regulation circuit including,
a first transistor connected between an input node that receives an input voltage to be regulated and an output node on which a regulated voltage is provided to the electronic circuitry;
first regulation loop circuitry that generates a first control voltage to control the first transistor, the first control voltage having a value based on a difference between a reference voltage and a first feedback voltage derived from the regulated voltage;
a second transistor coupled in series with the first transistor between the input node and the output node;
second regulation loop circuitry that generates a second control voltage to control the second transistor, the second control voltage having a value based on a difference between the reference voltage and a second feedback voltage derived from the regulated voltage and the second regulation loop being active in a low power regulation mode and a high power regulation mode;
a switch circuit that turns ON the first transistor during the low power regulation mode that is activated responsive to the battery being fully charged, and the switch circuit turns OFF the first transistor in response to the rechargeable battery being charged during the high power regulation mode; and
a feedback circuit coupled to the first control loop circuitry and second control loop circuitry to generate the first and second feedback voltages from the regulated voltage.

13. The portable electronic device of claim 12, wherein the feedback circuit comprises a resistive voltage divider circuit coupled between the output node and a reference voltage node.

14. The portable electronic device of claim 12, wherein the first transistor comprises one of a drift or extended channel type transistor.

15. The portable electronic device of claim 14, wherein the second transistor comprises a MOS or bipolar transistor.

16. The portable electronic device of claim 12, wherein the feedback circuit generates the first and second feedback voltages during the high power regulation mode.

17. The portable electronic device of claim 16, wherein the feedback circuit generates the first feedback voltage having a positive magnitude that is greater than a positive magnitude of the second feedback voltage.

18. The portable electronic device of claim 12, where the first and second regulation loop circuitry each include a respective error amplifier that generates the first and second control voltages.

* * * * *

UNITED STATES PATENT AND TRADEMARK OFFICE
CERTIFICATE OF CORRECTION

PATENT NO. : 9,958,889 B2
APPLICATION NO. : 14/868095
DATED : May 1, 2018
INVENTOR(S) : Alexandre Pons Page 1 of 1

It is certified that error appears in the above-identified patent and that said Letters Patent is hereby corrected as shown below:

On the Title Page

Item (*) Notice:
"Subject to any disclaimer, the term of this patent is extended or adjusted under 35 U.S.C. 154(b) by 0 days. days." should read --Subject to any disclaimer, the term of this patent is extended or adjusted under 35 U.S.C. 154(b) by 0 days.--.

In the Claims

Column 8, Line 24:
"voltage; wherein the first transistor is configured to" should read --voltage, wherein the first transistor is configured to--.

Column 8, Line 30:
"feedback voltage, the second regulation loop being, active in" should read --feedback voltage, the second regulation loop being active in--.

Signed and Sealed this
Twenty-first Day of May, 2019

Andrei Iancu
*Director of the United States Patent and Trademark Office*